United States Patent
Meyer et al.

(10) Patent No.: US 10,276,255 B2
(45) Date of Patent: Apr. 30, 2019

(54) SAMPLE-AND-HOLD CIRCUIT FOR AN ELECTRICAL SIGNAL

(71) Applicant: Thales, Courbevoie (FR)

(72) Inventors: Arnaud Meyer, Elancourt (FR); Bruno Louis, Elancourt (FR); Rémi Corbiere, Elancourt (FR); Vincent Petit, Elancourt (FR); Patricia Desgreys, Paris (FR); Hervé Petit, Paris (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 15/866,474

(22) Filed: Jan. 10, 2018

(65) Prior Publication Data

US 2018/0197618 A1    Jul. 12, 2018

(30) Foreign Application Priority Data

Jan. 10, 2017   (FR) ...................................... 17 00025

(51) Int. Cl.
| | | |
|---|---|---|
| *G11C 27/02* | (2006.01) | |
| *H03M 1/12* | (2006.01) | |
| *H03M 9/00* | (2006.01) | |

(52) U.S. Cl.
CPC ............. *G11C 27/02* (2013.01); *H03M 1/124* (2013.01); *H03M 9/00* (2013.01); *H03M 1/1245* (2013.01)

(58) Field of Classification Search
CPC ..... G11C 27/02; H03M 1/124; H03M 1/1245; H03M 9/00
See application file for complete search history.

(56) References Cited

U.S. PATENT DOCUMENTS

| | | | |
|---|---|---|---|
| 9,350,374 B2* | 5/2016 | Sundblad | H03M 1/004 |
| 9,413,394 B1* | 8/2016 | Lye | H03M 1/662 |
| 2002/0007386 A1* | 1/2002 | Martin | G11C 7/22 |
| | | | 708/316 |

(Continued)

FOREIGN PATENT DOCUMENTS

| | | |
|---|---|---|
| EP | 0843418 A1 | 5/1998 |
| FR | 3004875 A1 | 10/2014 |
| GB | 2069267 A | 8/1981 |

OTHER PUBLICATIONS

French Patent Application No. 17 00025, Rapport de Recherche Preliminaire, dated Dec. 6, 2017, 2 pages.

*Primary Examiner* — Thomas J. Hiltunen
(74) *Attorney, Agent, or Firm* — Soquel Group LLC

(57) ABSTRACT

Sample-and-hold device for an electrical signal including an input module having two inputs, including a first switching block including two input switches, each input of the input module being connected at the input of one of the input switches, the input module being connected at the input of a first track-and-hold module with two inputs and two outputs, so as to alternately convey the signal from one of the two inputs to one of the two inputs of the first track-and-hold module; the device including a second track-and-hold module connected in parallel with the first track-and-hold module, these track-and-hold modules connected at the output of the first switching block, and an output module including a second switching block including two output switches, the outputs of the first and second track-and-hold modules being connected to the inputs of the output switches, to time interleave the output signals of the track-and-hold modules.

9 Claims, 2 Drawing Sheets

(56) References Cited

U.S. PATENT DOCUMENTS

2007/0236380 A1* 10/2007 La Rue ............... H03M 1/1245
  341/155
2013/0278294 A1* 10/2013 Shibasaki ................ H03K 5/00
  327/97

* cited by examiner

SAMPLE-AND-HOLD CIRCUIT FOR AN ELECTRICAL SIGNAL

CROSS-REFERENCE TO RELATED APPLICATIONS

This application is based upon and claims the benefit of priority of the prior French Patent Application No. FR 17 00025, filed on Jan. 10, 2017, the entire contents of which are incorporated herein by reference.

FIELD OF THE INVENTION

The present invention relates to a sample-and-hold circuit for an electrical signal. The present invention is situated in the field of the analog-digital conversion of signals.

BACKGROUND

It is known to use sample-and-hold devices or circuits at the input of an analog-digital converter, to acquire a voltage value of the analog signal provided as input, and to keep the voltage value stable for the duration of the conversion, before the conversion of the voltage values into binary values.

It is in particular known to produce a sample-and-hold circuit with double switching, comprising two track-and-hold modules connected in series, a first master track-and-hold module being connected in series at the output of an input amplifier with two switches, and a second slave track-and-hold module being connected in series at the output of the first track-and-hold module. The second track-and-hold module is connected at the input of an output amplifier with two switches. The second track-and-hold module is commanded by a second clock signal in phase opposition relative to the first clock signal so as to track and maintain a held sample. Each track-and-hold module is able to operate alternately according to an on mode, then a held mode, based on the command clock signal.

Such a traditional structure makes it possible to obtain, as output, an output signal that is sampled twice as quickly as the signal coming from a single track-and-hold module.

However, such a circuit with two track-and-hold modules connected in series has several drawbacks.

A first drawback is that the second track-and-hold module holds the signal coming from the first track-and-hold module at the moment of the transition between the on mode and the held mode, which creates additional switching errors, and as a result, the linearity of the sample-and-hold device is deteriorated. Linearity of the sample-and-hold (S/H) device refers to the total harmonic distortion level, which is defined as the ratio of the overall root-mean-square value of the harmonics (i.e., their quadratic sum) to the root-mean-square value of the component.

A second drawback of such a sample-and-hold circuit is that the sampling moment between the two track-and-hold modules is linked and not controllable.

Lastly, a third drawback is that the noise factor is increased, since the noises respectively introduced by the track-and-hold devices are cumulative, due to the operation in master-slave mode.

SUMMARY

In order to mitigate certain drawbacks of the aforementioned state of the art, the invention proposes a sample-and-hold device for an electrical signal including an input module having two inputs, including a first switching block including two input switches, each input of the input module being connected at the input of one of said input switches, the input module being connected at the input of a first track-and-hold module with two inputs and two outputs, so as to alternately convey the signal from one of the two inputs to one of the two inputs of the first track-and-hold module. This device includes:

a second track-and-hold module connected in parallel with the first track-and-hold module, said first track-and-hold module and second track-and-hold module being connected at the output of the first switching block, and an output module including a second switching block including two output switches, the outputs of said first track-and-hold module and second track-and-hold module being connected to the inputs of the output switches so as to perform time interleaving of the output signals of the first track-and-hold module and the second track-and-hold module.

Advantageously, the sample-and-hold device includes two track-and-hold modules connected in parallel, the sampling moment of which is controllable independently. The linearity is increased and the noise factor is reduced.

The sample-and-hold device according to the invention may also have one or more of the following features, according to any technically possible combinations.

The first switching block comprises a first input switch and a second input switch, a first output of the first input switch being connected to a first input of the first track-and-hold module, and a second output of the first input switch being connected to a first input of the second track-and-hold module, a first output of the second input switch being connected to a second input of the first track-and-hold module, and a second output of the second input switch being connected to a second input of the second track-and-hold module.

In a first operating position, the first input switch connects the first input to the first input of the first track-and-hold module and the second input switch connects the second input to the second input of the first track-and-hold module.

In a second operating position, the first input switch connects the first input to the first input of the second track-and-hold module, and the second input switch connects the second input to the second input of the second track-and-hold module.

The device further includes a first feedback loop connected between the outputs and the inputs of the first track-and-hold module, and a second feedback loop connected between the outputs and the inputs of the second track-and-hold module.

The device further comprises a clock generator, able to generate a first clock signal with a predetermined frequency, and a second clock signal, with a same predetermined frequency, reversed relative to the first clock signal.

The first track-and-hold module is commanded by the first clock signal, and the second track-and-hold module is commanded by the second clock signal.

The first switching block is commanded by said first clock signal able to command the switching of the two input switches of the first switching block between a first operating position and a second operating position.

The second switching block is commanded by said second clock signal able to command the switching of the two output switches between a first operating position and a second operating position.

Said first clock signal and second clock signal have a duty cycle ratio differing by 50%, and in which an offset current is applied to the clock generator, so as to correct the duty cycle ratio.

BRIEF DESCRIPTION OF THE DRAWINGS

Other features and advantages of the invention will emerge from the description thereof provided below, for information and non-limitingly, in reference to the appended figures, in which.

DETAILED DESCRIPTION

Figure 1:
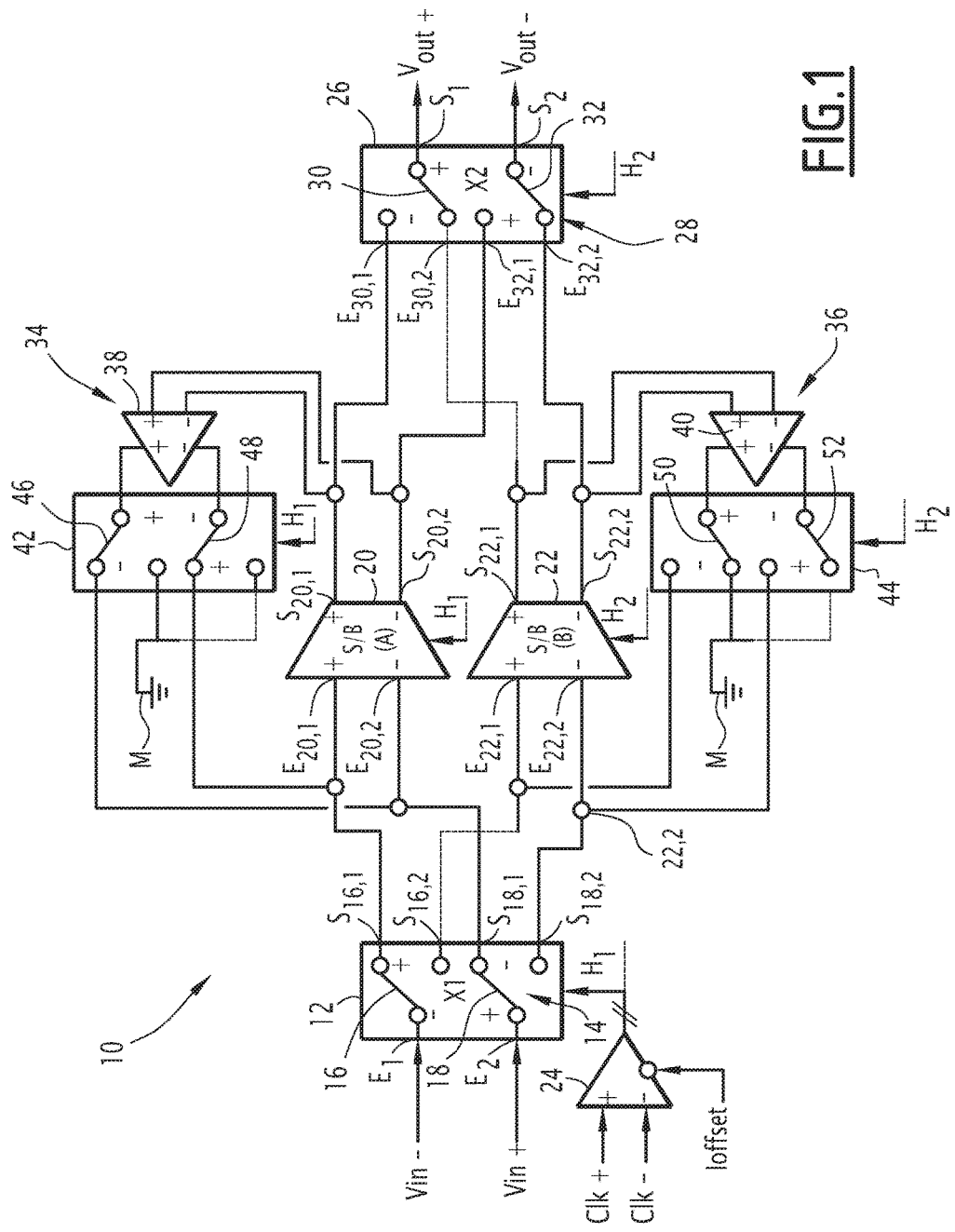
FIG. 1 shows a sample-and-hold device according to one embodiment of the invention.

FIG. 1 shows a sample-and-hold device 10 according to one embodiment of the invention.

The sample-and-hold device 10 is a sample-and-hold device with two channels, operating by time interleaving.

This sample-and-hold device 10 includes an input module 12, which performs an amplification function and a switching function.

The input module 12 has two signal inputs, a first input $E_1$ and a second input $E_2$.

The input module 12 comprises a first switching block 14 with two switches 16, 18, called input switches, the first input $E_1$ being connected to the input of the first input switch 16, and the second input $E_2$ being connected to the input of the second input switch 18.

The inputs are supplied, when the sample-and-hold device 10 is powered on, by an alternating current source, not shown. In the example, a voltage $V_{in-}$ is supplied on the first input $E_1$ and a voltage $V_{in+}$ on the second input $E_2$.

Each of the input switches 16, 18 has an input and two outputs, respectively denoted $S_{16.1}$ and $S_{16.2}$ for the first input switch 16, and $S_{18.1}$ and $S_{18.2}$ for the second input switch 18.

The sample-and-hold device 10 includes two track-and-hold modules 20, 22, which are connected in parallel, a first track-and-hold module 20 corresponding to a first signal processing channel, denoted channel A, and a second track-and-hold module 22, corresponding to a second signal processing channel, denoted channel B.

Each track-and-hold module 20, 22 is a device with two inputs and two outputs.

A track-and-hold module refers to a circuit paced at a clock frequency that tracks the signal allowed at its input during the first half-period of the clock and maintains (holds) the captured signal during the second half-period of the clock. Such devices are known and are made here according to any embodiment known by those skilled in the art.

The first output $S_{16.1}$ of the first input switch 16 is connected to the first input $E_{20.1}$ of the first track-and-hold module 20, and the second output $S_{16.2}$ of the first input switch 16 is connected to the first input $E_{22.1}$ of the second track-and-hold module 22.

The first output $S_{18.1}$ of the second input switch 18 is connected to the second input $E_{20.2}$ of the first track-and-hold module 20, and the second output $S_{18.2}$ of the second input switch 18 is connected to the first input $E_{22.2}$ of the second track-and-hold module 22.

The first switching block 14 is commanded by a clock signal $H_1$, emitted by a clock generator 24.

The clock signal $H_1$ has a given clock frequency $F_S$.

The two input switches 16, 18 of the first switching block 14 are thus commanded to periodically switch to the period $1/F_S$, as a function of the frequency of the command signal, which is the clock signal $H_1$, between a first operating position and a second operating position.

In the first operating position, which corresponds to a so-called on operating mode, the first input switch 16 connects the first input $E_1$, after amplification, to the first input $E_{20.1}$ of the first track-and-hold module 20, and the second input switch 18 connects the second input $E_2$, after amplification, to the second input $E_{20.2}$ of the first track-and-hold module 20.

In the second operating position, which corresponds to a so-called held operating mode, the first input switch 16 connects the first input $E_1$, after amplification, to the first input $E_{22.1}$ of the second track-and-hold module 22, and the second input switch 18 connects the second input $E_2$, after amplification, to the second input $E_{22.2}$ of the second track-and-hold module 22.

In other words, the first switching block 14 deviates the input signal toward the first track-and-hold module 20 (channel A) in the on mode and the input signal toward the second track-and-hold module 22 (channel B) in the held mode.

Thus, the first switching block 14 performs the multiplexing of the input signal, in an alternating manner, between the channel A, corresponding to the first track-and-hold module 20, and the channel B, corresponding to the second track-and-hold module 22.

According to one alternative embodiment, the input module 12 performs only the switching function described above, without amplification.

Advantageously, the switching done by this connection of the first switching block 14 makes it possible to pool the input current, which makes it possible to use, in the input module 12, an amplifier dimensioned for a load of a single track-and-hold module, and not two separate track-and-hold modules. Consequently, energy is thus saved.

Furthermore, advantageously, the first switching block 14 makes it possible to increase the insulation of the inputs $E_1$, $E_2$ relative to the track-and-hold module that holds the sample.

The track-and-hold modules 20, 22 process the input signals independently.

Each of the track-and-hold modules 20, 22 is commanded by a respective command clock signal H1, H2, the clock signal $H_2$ being derived from the same clock generator 24, but reversed relative to the clock signal $H_1$.

In other words, the clock signal $H_2$ is in phase opposition relative to the clock signal $H_1$.

The clock signal $H_2$ has the same clock frequency $F_S$ as the clock signal $H_1$.

In one embodiment, the command clock signal $H_1$, which commands the first track-and-hold module 20, is the same as the command clock signal of the first switching block 14.

Thus, the track-and-hold modules 20, 22 are commanded in opposition.

Advantageously, the first and second track-and-hold modules 20, 22 operate in parallel, which makes it possible to double the sampling frequency, while limiting the noise factor relative to a connection of track-and-hold modules in series, and while improving the linearity.

The sample-and-hold device 10 also comprises an output module 26, which performs the recombination of the samples into one output signal, by time interleaving.

In one embodiment, the output module 26 also performs an amplification.

The output module 26 comprises a second switching block 28 with two output switches 30, 32, each of the output switches having two inputs and one output.

A first output $S_{20.1}$ of the first track-and-hold module 20 is connected to a first input $E_{30.1}$ of the first output switch 30, and a second output $S_{20.2}$ of the first track-and-hold module 20 is connected to a first input $E_{32.1}$ of the second output switch 32.

A first output $S_{22.1}$ of the second track-and-hold module 20 is connected to a second input $E_{30.2}$ of the first output switch 30, and a second output $S_{22.2}$ of the second track-and-hold module 22 is connected to a second input $E_{32.2}$ of the second output switch 32.

The outputs $S_1$, $S_2$ of the output module 26 are the outputs of the sample-and-hold device 10.

The second switching block 28 is commanded by the clock signal $H_2$, which is reversed relative to the first clock signal $H_1$ commanding the first switching block 14.

The two output switches 30, 32 of the second switching block 28 are thus commanded to switch periodically, as a function of the command signal, which is the clock signal $H_2$, between a first operating position and a second operating position.

In the first operating position, the first output switch 30 connects the first output $S_{22.1}$ of the second track-and-hold module 22, after amplification, to the first output $S_1$, and the second output switch 32 connects the second output $S_{22.2}$ of the second track-and-hold module 22, after amplification, to the second output $S_2$.

In the second operating position, the first output switch 30 connects the first output $S_{20.1}$ of the first track-and-hold module 20, after amplification, to the first output $S_1$, and the second output switch 32 connects the second output $S_{20.2}$ of the first track-and-hold module 20, after amplification, to the second output $S_2$.

In other words, the second switching block 28, which performs a synchronized recombination function, paced by the clock signal $H_2$, sends the signal from the channel B to the output when this channel is in the held mode and the signal from the channel A to the output when this channel is in the held mode.

Furthermore, for each of the respective channels, channel A and channel B, a feedback loop 34, 36 is connected between the outputs and the inputs.

Each of the feedback loops 34, 36 is made up, in the traditional so-called double-switching mode, of an operational amplifier 38, 40 and a switching block 42, 44 with two inputs, four outputs, two outputs of which are connected to the ground M.

Thus, the respective outputs $S_{20.1}$ and $S_{20.2}$ of the first track-and-hold module 20 are connected to the inputs of the amplifier 38, the outputs of which are provided as input to the third switching block 42 including two switches 46, 48.

In a first operating position of the third switching block 42, a first output of the amplifier 38, corresponding to the first output $S_{20.1}$ of the first track-and-hold module 20, is brought onto the first input $E_{20.1}$ of the first track-and-hold module 20, and a second output of the amplifier 38, corresponding to the second output $S_{20.2}$ of the first track-and-hold module 20, is brought back onto the second input $E_{20.2}$ of the first track-and-hold module 20.

In a second operating position of the third switching block 42, the first output and the second output of the amplifier 38 are brought back to the ground M.

The third switching block 42 is commanded by the clock signal $H_1$, synchronized with the command signal of the first track-and-hold module 20.

The respective outputs $S_{22.1}$ and $S_{22.2}$ of the second track-and-hold module 22 are connected to the inputs of the amplifier 40, the outputs of which are provided as input to the fourth switching block 44 including two switches 50, 52.

In a first operating position of the fourth switching block 44, a first output of the amplifier 40, corresponding to the first output $S_{22.1}$ of the second track-and-hold module 22, is brought onto the first input $E_{22.1}$ of the second track-and-hold module 22, and a second output of the amplifier 40, corresponding to the second output $S_{22.2}$ of the second track-and-hold module 20, is brought back onto the second input $E_{22.2}$ of the second track-and-hold module 22.

In a second operating position of the fourth switching block 44, the first output and the second output of the amplifier 40 are brought back to the ground M.

The fourth switching block 44 is commanded by the clock signal $H_2$, synchronized with the command signal of the second track-and-hold module 22.

In one optimized embodiment, in order to improve the synchronization between the channel A and the channel B, and independently of the sampling frequency, an offset current, $I_{offset}$, is applied at the input of a limiter amplifier to correct the value of the duty cycle ratio of the two channels.

Figure 2:
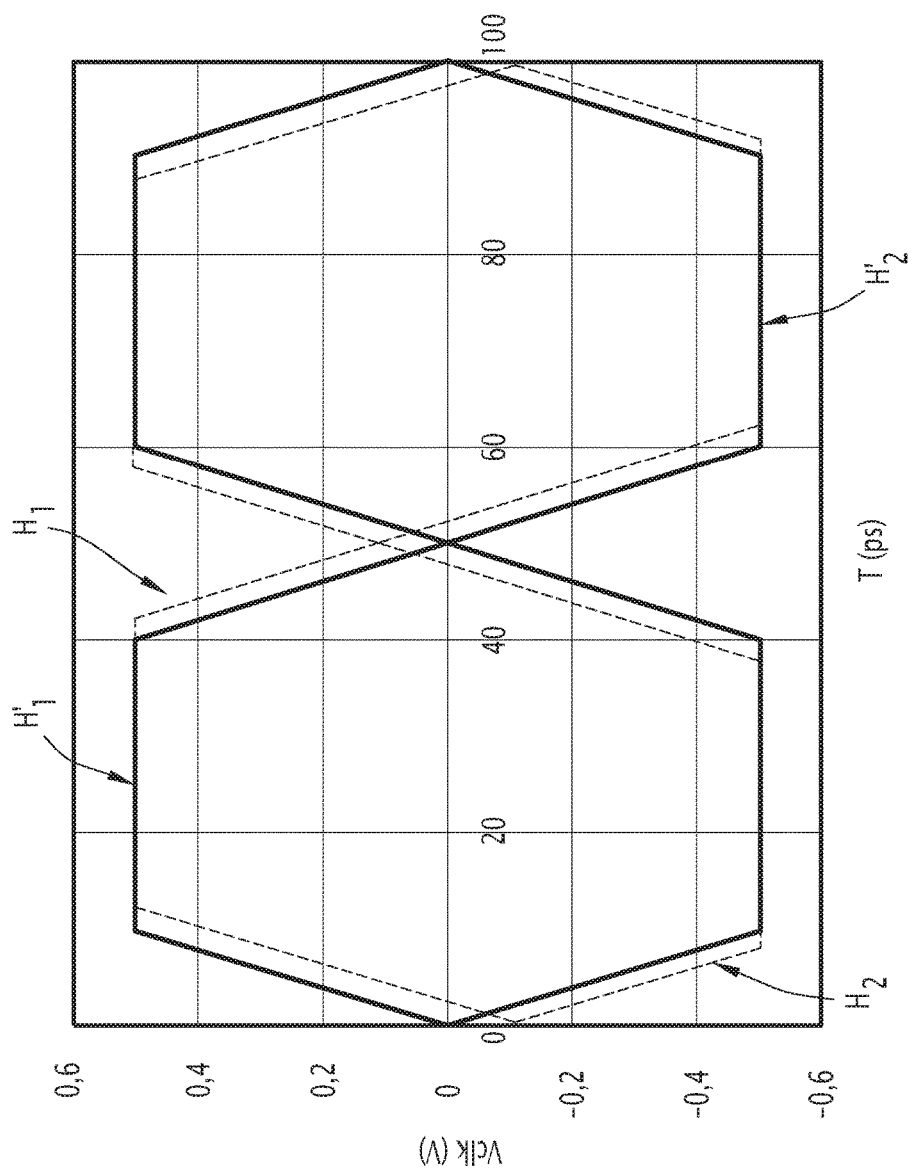
FIG. 2 shows an example timing diagram of clock signals, with and without correction by an offset current.

FIG. 2 shows an example timing diagram of clock signals $H_1$ and $H_2$, before and after application of an offset current $I_{offset}$.

The graph of FIG. 2 illustrates the voltage ($V_{clk}$) of the clock signals in volts as a function of time in picoseconds.

The clock signals $H_1$, $H_2$ are shown in dotted lines before application of the offset current $I_{offset}$, and the same clock signals, denoted $H'_1$, $H'_2$, are shown in solid lines after application of the offset current $I_{offset}$.

The value of the offset current $I_{offset}$ to be applied, which may be positive or negative, is determined by the deviation measured between the duty ratio of the cycles at the outputs and a reference duty cycle ratio of 50%.

Owing to the application of the offset current $I_{offset}$, the duty cycle ratio between the clock signals $H_1$ and $H_2$ is decreased to 50%, as can be seen in FIG. 2.

When the duty cycle ratio of the clock signals of the two channels is greater than 50%, a positive offset current makes it possible to reduce this duty cycle ratio to reach 50%. When the duty cycle ratio of the clock signals of the two channels is less than 50%, a negative offset current makes it possible to increase the latter to reach 50%.

The application of an offset current $I_{offset}$ makes it possible to correct the output signal of the sample-and-hold device by an offset voltage.

Advantageously, the use of an offset current makes it possible to improve the synchronization and linearity of the sample-and-hold device, without requiring subsequent digital processing.

The described sample-and-hold device 10 makes it possible to perform sampling with a sampling frequency $2 \times F_S$, equal to twice the frequency $F_S$ of the clock signal generated by the clock generator 24. Alternatively, it is possible to combine N track-and-hold modules connected in parallel according to the principle of the invention described above to perform sampling with a frequency of $N \times F_S$.

The invention claimed is:

1. A sample-and-hold device for an electrical signal comprising:
    an input module having two inputs, comprising a first switching block comprising two input switches, each input of the input module being connected at the input of one of said input switches, the input module being connected at the input of a first track-and-hold module with two inputs and two outputs, so as to alternately convey the signal from one of the two inputs of the input module to one of the two inputs of the first track-and-hold module;

a second track-and-hold module connected in parallel with the first track-and-hold module, said first track-and-hold module and second track-and-hold module being connected at the output of the first switching block;

an output module comprising a second switching block comprising two output switches, the outputs of said first track-and-hold module and second track-and-hold module being connected to the inputs of the output switches so as to perform time interleaving of the output signals of the first track-and-hold module and the second track-and-hold module;

a first feedback loop connected between the outputs and the inputs of the first track-and-hold module; and a second feedback loop connected between the outputs and the inputs of the second track-and-hold module.

2. The sample-and-hold device according to claim 1, wherein the first switching block comprises a first input switch and a second input switch, a first output of the first input switch being connected to a first input of the first track-and-hold module, and a second output of the first input switch being connected to a first input of the second track-and-hold module, a first output of the second input switch being connected to a second input of the first track-and-hold module, and a second output of the second input switch being connected to a second input of the second track-and-hold module.

3. The sample-and-hold device according to claim 2, wherein in a first operating position, the first input switch connects the first input to the first input of the first track-and-hold module, and the second input switch connects the second input to the second input of the first track-and-hold module.

4. The sample-and-hold device according to claim 2, wherein in a second operating position, the first input switch connects the first input to the first input of the second track-and-hold module, and the second input switch connects the second input to the second input of the second track-and-hold module.

5. The sample-and-hold device according to claim 1, further comprising a clock generator, able to generate a first clock signal with a predetermined frequency, and a second clock signal, with a same predetermined frequency, reversed relative to the first clock signal.

6. The sample-and-hold device according to claim 5, wherein the first track-and-hold module is commanded by the first clock signal, and the second track-and-hold module is commanded by the second clock signal.

7. The sample-and-hold device according to claim 5, wherein the first switching block is commanded by said first clock signal able to command the switching of the two input switches of the first switching block between a first operating position and a second operating position.

8. The sample-and-hold device according claim 5, wherein the second switching block is commanded by said second clock signal able to command the switching of the two output switches between a first operating position and a second operating position.

9. The sample-and-hold device according to claim 5, wherein said first clock signal and second clock signal have a duty cycle ratio differing by 50%, and in which an offset current is applied to the clock generator, so as to correct the duty cycle ratio.

* * * * *